(12) United States Patent
Cabos et al.

(10) Patent No.: US 10,978,993 B2
(45) Date of Patent: *Apr. 13, 2021

(54) SYSTEM FOR REDIRECTING SUNLIGHT TO A MOBILE PLATFORM

(71) Applicant: THE BOEING COMPANY, Chicago, IL (US)

(72) Inventors: Ralf René Shu-Zhong Cabos, Lower Saxony (DE); Nils Kneuper, Bergkamen (DE)

(73) Assignee: THE BOEING COMPANY, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/807,656

(22) Filed: Mar. 3, 2020

(65) Prior Publication Data

US 2020/0382051 A1 Dec. 3, 2020

Related U.S. Application Data

(63) Continuation of application No. 15/977,321, filed on May 11, 2018, now Pat. No. 10,601,367.

(51) Int. Cl.
H02S 40/22 (2014.01)
B64G 1/10 (2006.01)
B64C 39/02 (2006.01)
B64D 27/24 (2006.01)
H02S 40/38 (2014.01)
B64G 1/44 (2006.01)
H02S 10/40 (2014.01)

(52) U.S. Cl.
CPC ............ *H02S 40/22* (2014.12); *B64C 39/024* (2013.01); *B64D 27/24* (2013.01); *B64G 1/10* (2013.01); *B64G 1/443* (2013.01); *H02S 10/40* (2014.12); *H02S 40/38* (2014.12); *B64C 2201/042* (2013.01); *B64C 2201/066* (2013.01); *B64D 2211/00* (2013.01)

(58) Field of Classification Search
CPC ..................................................... H02S 40/22
See application file for complete search history.

(56) References Cited

U.S. PATENT DOCUMENTS 4,573,214 A 2/1986 Mooradian
7,612,284 B2 * 11/2009 Rogers ................... B64G 1/428
136/246

(Continued)

FOREIGN PATENT DOCUMENTS

WO 2017174110 A1 10/2017
WO 2018027331 A1 2/2018

(Continued)

*Primary Examiner* — Alex C Dunn
(74) *Attorney, Agent, or Firm* — Armstrong Teasdale LLP

(57) ABSTRACT

A system for redirecting light to a mobile platform includes a satellite and a mobile platform including a first RF antenna that transmits a trajectory data for the mobile platform, and a photovoltaic cell that converts light into electrical energy. The satellite includes a second RF antenna that receives the trajectory data, and a processor coupled to the second RF antenna. The processor computes a target position of the mobile platform based on the trajectory data, and instructs a diffuser system to generate the beam of light and direct the beam to the target position.

20 Claims, 8 Drawing Sheets

(56) References Cited

U.S. PATENT DOCUMENTS

| | | | |
|---|---|---|---|
| 7,977,532 B2 | 8/2011 | Tillotson | |
| 7,997,532 B2* | 8/2011 | Tillotson | F24S 20/80 244/127 |
| 8,359,128 B1 | 1/2013 | Segal et al. | |
| 8,450,597 B2* | 5/2013 | Zahuranec | H01L 31/0547 136/246 |
| 8,646,227 B2* | 2/2014 | Zahuranec | F24S 25/13 52/173.3 |
| 9,240,510 B2* | 1/2016 | Correia | F24S 40/85 |
| 9,315,267 B2 | 4/2016 | Pan et al. | |
| 9,422,922 B2* | 8/2016 | Sant'Anselmo | F03D 9/11 |
| 9,559,632 B2 | 1/2017 | Ahn | |
| 9,570,795 B1* | 2/2017 | Bruce | H02S 20/00 |
| 9,819,410 B1 | 11/2017 | Azevedo et al. | |
| 10,110,056 B2* | 10/2018 | Dyer | H02J 7/34 |
| 10,454,565 B2* | 10/2019 | Pellegrino | H03F 1/0261 |
| 2006/0187654 A1* | 8/2006 | Jungel-Schmid | F21S 10/007 362/147 |
| 2006/0201547 A1* | 9/2006 | Rogers | B64G 1/446 136/201 |
| 2007/0227574 A1* | 10/2007 | Cart | F24S 50/00 136/206 |
| 2009/0292407 A1 | 11/2009 | Minelli et al. | |
| 2010/0006088 A1* | 1/2010 | Campbell | F24S 30/422 126/573 |
| 2010/0224231 A1* | 9/2010 | Hoke | H01L 31/0543 136/246 |
| 2014/0128032 A1* | 5/2014 | Muthukumar | H04W 12/06 455/411 |
| 2014/0146741 A1* | 5/2014 | Azancot | H04W 84/12 370/315 |
| 2015/0009567 A1* | 1/2015 | Freier | F24S 23/71 359/597 |
| 2016/0013923 A1* | 1/2016 | Malaga | H04L 5/14 370/277 |
| 2016/0336897 A1 | 11/2016 | Yang | |
| 2017/0012155 A1* | 1/2017 | Holman | H01L 31/0547 |
| 2017/0137138 A9 | 5/2017 | Hunter | |
| 2017/0324148 A1* | 11/2017 | Stevenson | H01Q 1/241 |
| 2017/0353145 A1 | 12/2017 | Yang | |
| 2018/0013211 A1* | 1/2018 | Ricci | G05B 15/02 |
| 2018/0039070 A1 | 2/2018 | Mao et al. | |
| 2018/0054159 A1 | 2/2018 | Ahdoot et al. | |
| 2018/0069503 A1 | 3/2018 | Nicklas | |
| 2018/0076761 A1 | 3/2018 | Rehder | |
| 2018/0115276 A1 | 4/2018 | Wildman et al. | |
| 2018/0128951 A1 | 5/2018 | Panzlaff et al. | |
| 2018/0131229 A1 | 5/2018 | Valin | |
| 2018/0372949 A1* | 12/2018 | Abramov | G02B 19/0019 |
| 2019/0154439 A1* | 5/2019 | Binder | G01S 15/08 |

FOREIGN PATENT DOCUMENTS

| | | | | |
|---|---|---|---|---|
| WO | 2018078659 A1 | 5/2018 | | |
| WO | 2018204896 A1 | 11/2018 | | |
| WO | WO-2018204896 A1 * | 11/2018 | | B64D 41/00 |

* cited by examiner

SYSTEM FOR REDIRECTING SUNLIGHT TO A MOBILE PLATFORM

CROSS-REFERENCE TO RELATED APPLICATIONS

This application is a Continuation of U.S. patent application Ser. No. 15/977,321 filed on May 11, 2018, the contents of which are hereby incorporated by reference herein.

FIELD

The field of the disclosure relates generally to solar powering of mobile platforms and, more specifically, to a system for redirecting sunlight to an airborne vehicle.

BACKGROUND

Achievements in unmanned and autonomous technology have enabled mobile platforms, such as, for example, land and sea vehicles, airborne vehicles, and space vehicles, to operate for indefinite periods of time. One limitation of such a mobile platform is its finite energy source. Many mobile platforms utilize an onboard fuel, such as, for example, a fossil fuel, fuel cell, or chemical battery, that is depleted over time of operation until the mobile platform is forced to refuel. At least some mobile platforms incorporate photovoltaic (PV) cells onto their skins, structures, or otherwise onboard the mobile platform to utilize as a direct energy source or to replenish an energy storage device, such as a chemical battery.

Incorporation of PV cells onto a mobile platform is an effective solution to extend time of operation, i.e., endurance, range, loiter, or time-on-station. However, a natural limitation of PV cells is their inability to harvest energy when sunlight is scarce or, in other words, at night. This limitation extends further to land and sea vehicles that may, from time to time, have to contend with weather conditions that diminish the availability of sunlight from which their onboard PV cells harvest energy; unlike aerial vehicles that avoid such conditions when operating at altitude, or above the cloud layer in the Earth's atmosphere. Similarly, space vehicles, such as satellites, often utilize PV cells to harvest energy from sunlight. However, even such space vehicles, from time to time, pass through the Earth's shadow.

BRIEF DESCRIPTION

One aspect of the present disclosure includes a system for redirecting sunlight to a mobile platform. The system includes a satellite and a mobile platform. The mobile platform travels along a path at a velocity. The mobile platform includes a first RF antenna configured to transmit a message including a position of the mobile platform on the path, the velocity, and a time of transmission. The mobile platform includes a photovoltaic (PV) cell configured to receive a beam of light and convert the beam of light into electrical energy. The satellite includes a second RF antenna, an optical channel, a collector system, a diffuser system, and a processor. The second RF antenna receives the message from mobile platform. The collector system is coupled to the optical channel and is configured to gather sunlight into the optical channel. The diffuser system is coupled to the optical channel and configured to diffuse light from the optical channel to generate the beam of light. The processor is coupled to the second RF antenna and is configured to compute a target position of the mobile platform based on the position, the velocity, and the time. The processor is configured to instruct the diffuser system to direct the beam of light to the target position of the mobile platform.

Another aspect of the present disclosure includes a method of redirecting sunlight from a satellite to a mobile platform. The method includes receiving a message from the mobile platform at an RF antenna, the message including a position of the mobile platform, a velocity of the mobile platform, and a time at which the message was transmitted. The method includes gathering sunlight at a collector system of the satellite into an optical channel coupled between the collector system and a diffuser system of the satellite. The method includes diffusing the sunlight from the optical channel at the diffuser system to generate a beam of light. The method includes computing, using a processor coupled to the RF antenna, a target position of the mobile platform based on the position, the velocity, and the time. The method includes instructing the diffuser system to direct the beam of light to the target position of the mobile platform.

Yet another aspect of the present disclosure includes a satellite. The satellite includes a radio frequency (RF) antenna, an optical channel, a collector system, a diffuser system, and a processor. The RF antenna is configured to receive a message from a mobile platform traveling at a velocity, the message including a position of the mobile platform, the velocity, and a time at which the message was transmitted. The collector system is coupled to the optical channel and is gathers sunlight into the optical channel. The diffuser system is coupled to the optical channel and diffuses light from the optical channel to generate a beam of light. The processor is coupled to the RF antenna and computes a target position of the mobile platform based on the position, the velocity, and the time. The processor further instructs the diffuser system to direct the beam of light to the target position of the mobile platform.

The features, functions, and advantages that have been discussed can be achieved independently in various embodiments or may be combined in yet other embodiments further details of which can be seen with reference to the following description and drawings.

DETAILED DESCRIPTION

Embodiments of the systems described herein include a satellite operating in the path of sunlight and that redirects at least some sunlight to a known position of a mobile platform. The redirected sunlight arrives at the mobile platform in the form of a beam that is received by onboard PV cells and converted to electrical energy that is supplied to an electrical load, such as, for example, an energy storage system, an electronic system, or a propulsion system. Embodiments of the satellites described herein provide a collector, or solar collector, that gathers sunlight and directs it into an optical channel that carries the sunlight to a diffuser, or solar diffuser, that transmits a beam of light directed to a location of the mobile platform. Embodiments of the mobile platforms described herein travel along a known path and communicate their position and trajectory, e.g., velocity, to the satellite to enable the satellite to direct the beam of light to an appropriate location for the mobile platform to receive. Such mobile platforms further provide PV cells that receive the beam of light and convert the light into electrical energy. In certain embodiments, the mobile platforms described herein are aerial vehicles or space vehicles, manned or unmanned. Manned mobile platforms experience diminished benefits of the system described herein, because such mobile platforms are typically larger, demand more energy, and are further limited in time of operation to the extent onboard human personnel cannot operate indefinitely. Conversely, unmanned aerial vehicles (UAV) are generally more energy-efficient and are not limited by human personnel. Alternative embodiments of the systems described herein are equally applicable to land or sea vehicles; however, the performance of the system is subject to the ability of the mobile platform to receive a beam of light substantially unobstructed by terrain or weather.

Figure 1:
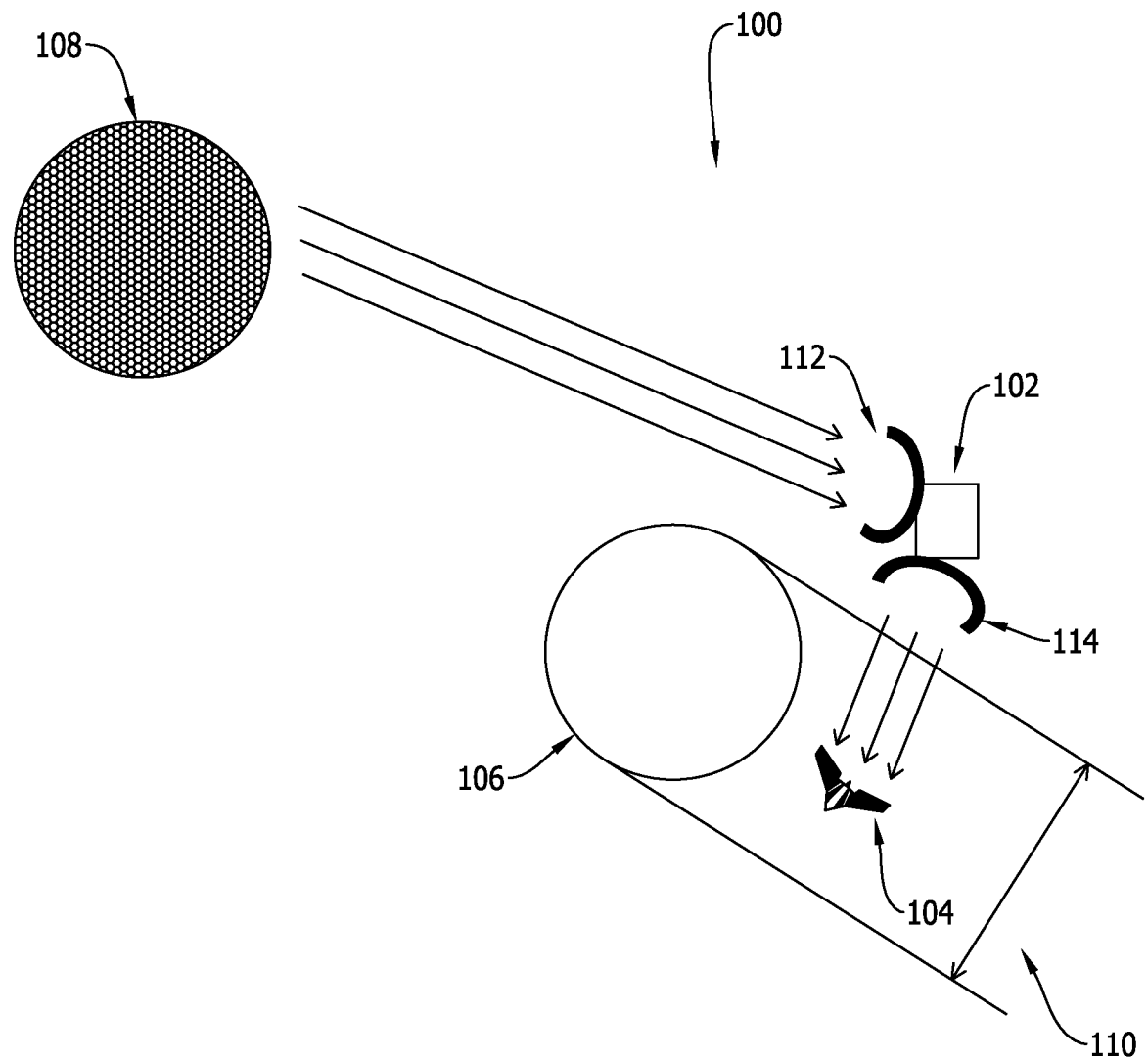
FIG. 1 is a schematic diagram of an embodiment of a system for redirecting sunlight.

FIG. 1 is a schematic diagram of an embodiment of a system 100 for redirecting sunlight. System 100 includes a satellite 102 and a mobile platform 104. In the embodiment of FIG. 1, mobile platform 104 is depicted as an aerial vehicle, such as an airplane, balloon, glider, rotor-craft or any other suitable aircraft; however, in alternative embodiments, mobile platform 104 may be any mobile system including, for example, a land or sea vehicle, such as a truck, ship, or manned or unmanned undersea vehicle, or a space vehicle, such as a satellite or space station. With reference to FIG. 1, satellite 102 is in orbit around Earth 106, which itself is orbiting around the sun 108. Mobile platform 104 is operating in an area that, due to the orbit of Earth 106 around sun 108, is at least partially shaded by Earth 106, i.e., mobile platform 104 is operating in Earth's shadow 110. Mobile platform 104 includes a PV system having PV cells for receiving sunlight and converting it to electrical energy for supplying an electrical load, such as, for example, an energy storage device, an electronic circuit, or a propulsion system.

Satellite 102, given its orbit around Earth 106, is at least sometimes exposed to direct sunlight when mobile platform 104 is not, as is illustrated in FIG. 1. Satellite 102 includes a collector system 112 that gathers sunlight and focuses it into an optical channel (not shown) that carries the light to a diffuser system 114. Diffuser system 114 diffuses the light from the optical channel to generate a beam that is directed to the location of mobile platform 104. Mobile platform's PV system receives the redirected light and converts it into electrical energy.

Figure 2:
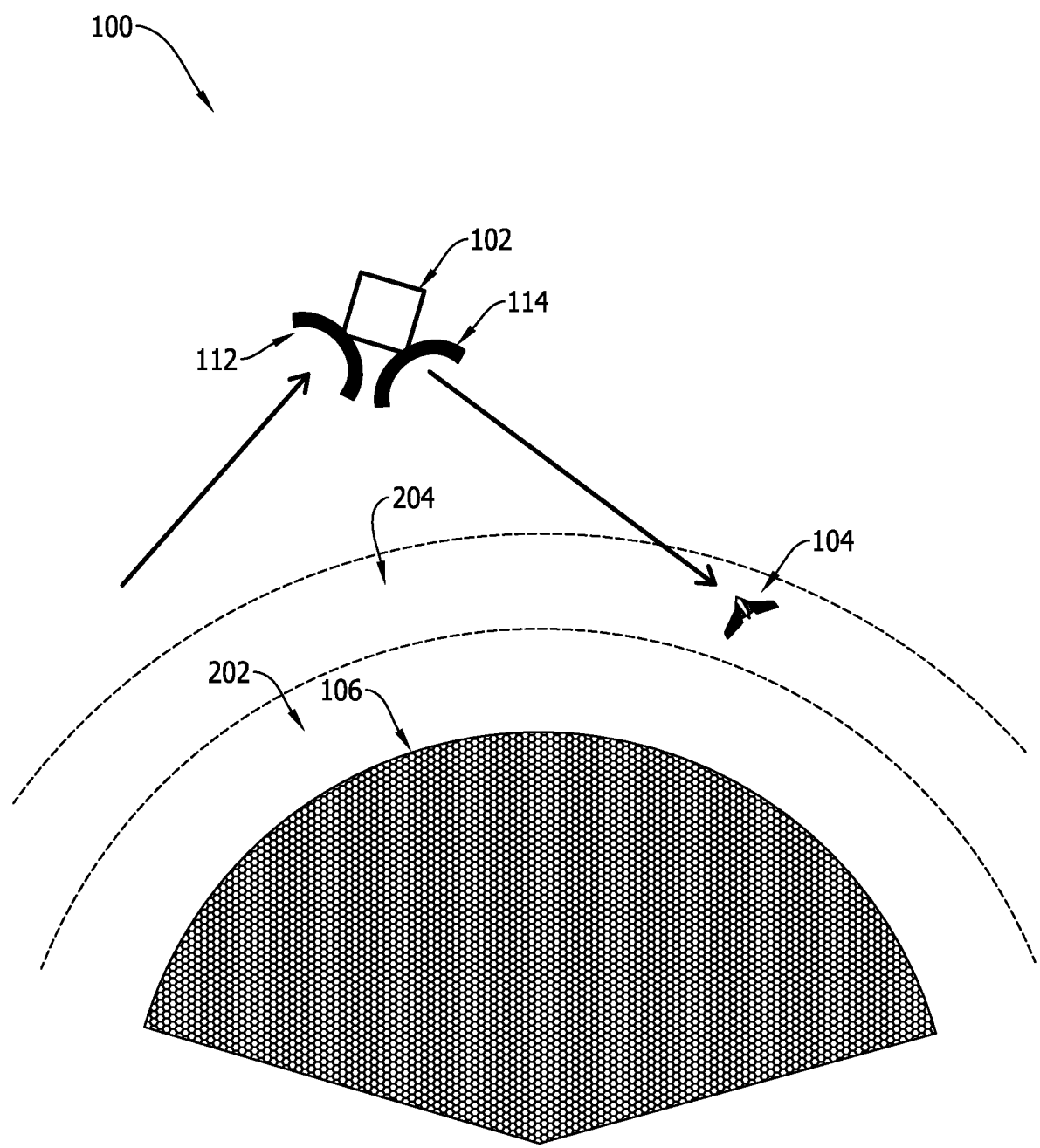
FIG. 2 is another schematic diagram of the system shown in FIG. 1.

FIG. 2 is another schematic diagram of system 100 shown in FIG. 1, including satellite 102 and mobile platform 104. Satellite 102 is illustrated in orbit around Earth 106. Satellite 102 may orbit at any suitable altitude above sea level. For example, satellites described herein orbit above about 100 miles above sea level. Higher altitude orbit has the benefits of more exposure to direct sunlight undisturbed by the Earth's atmosphere, and further enables redirection of sunlight to space vehicles in lower orbit.

Mobile platform 104, in certain embodiments, is an aerial vehicle operating above the cloud layer of Earth's atmosphere, and ideally above any weather. For example, mobile platform 104 may operate in the Troposphere 202 and Stratosphere 204, or from zero to about 31 miles above sea level. Weather is generally contained in the Troposphere 202, which extends up to about 30,000 feet to 56,000 feet, depending on weather. Accordingly, for the purpose of the system described herein, it is preferable for mobile platform 104 to operate at an altitude above this range, or in the Stratosphere 204, or above about 30,000 feet to 56,000 feet. At such altitudes, the performance of system 100 is generally not degraded by weather, although performance may still be degraded by atmospheric effects on the redirected light.

Air mass of a volume, e.g., an atmospheric layer, represents the distance light travels relative to a vertical sun position. In one embodiment, where satellite 102 is in orbit outside of the Earth's atmosphere, the air mass at the position of satellite 102 is zero, at which sunlight contains approximately 1367 Watts per meter-squared. The air mass of the Earth's atmosphere is approximately one at the Equator for a vertical sun position. Furthermore, the air mass of the Earth's atmosphere is generally assumed to be 1.5 at a position away from the Equator. In other words, sunlight travels about 1.5 times the distance through the atmosphere to a position away from the Equator relative to the vertical distance to the Equator itself. With an air mass of 1.5, sunlight contains approximately 1000 Watts per meter-squared. The distance the light travels is further reduced for a mobile platform 104 operating at an altitude of about 7 miles, as opposed to the light traveling to sea level. In such a case, for example, a beam of light delivers approximately 1187 Watts per meter-squared to the mobile platform 104 operating at an altitude of about 7 miles.

Figure 3:
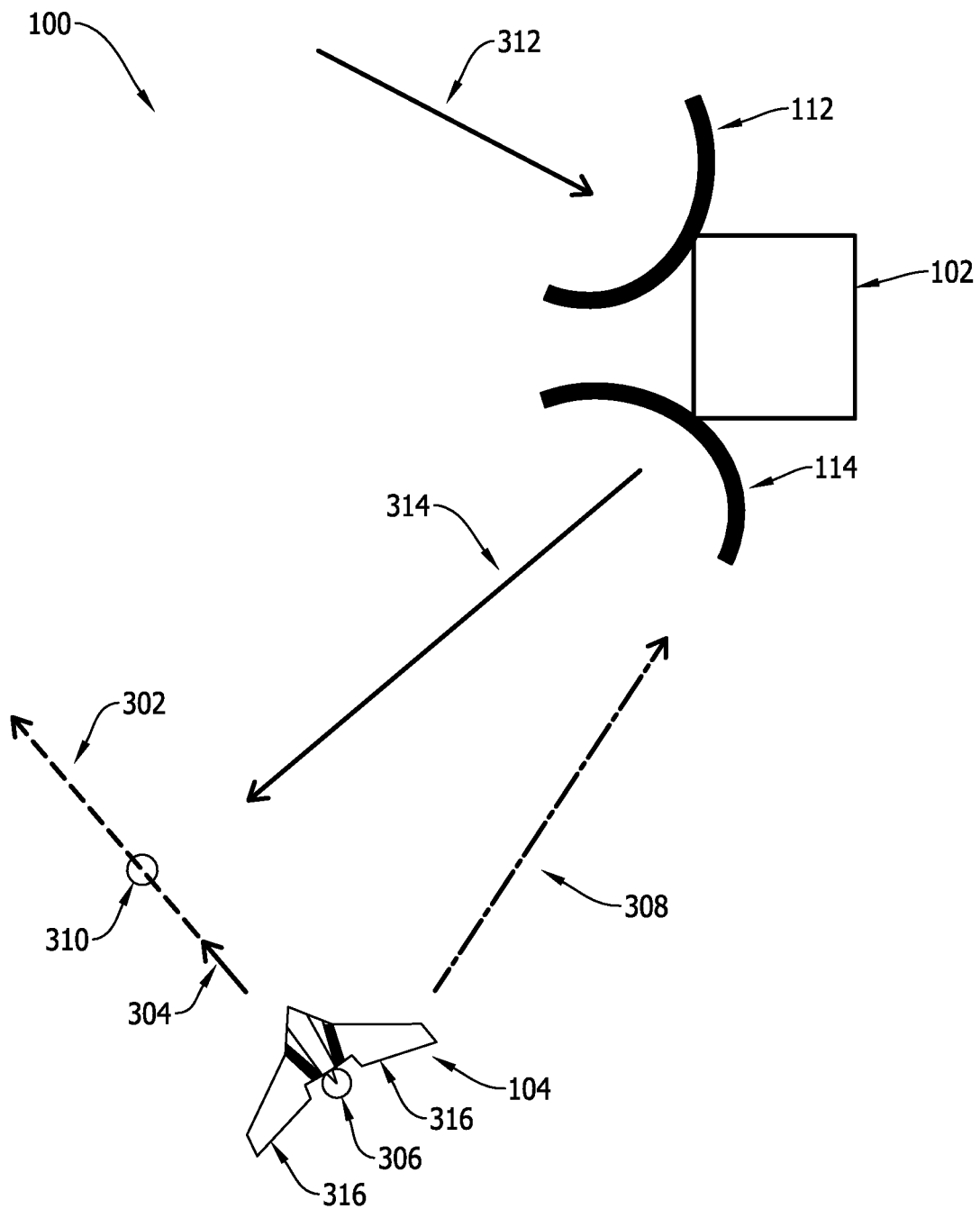
FIG. 3 is yet another schematic diagram of the system shown in FIG. 1 and FIG. 2.

FIG. 3 is yet another schematic diagram of system 100 shown in FIG. 1 and FIG. 2, including satellite 102 and mobile platform 104. As mobile platform 104 moves along a path 302 at some velocity 304 from an initial position 306, mobile platform 104 transmits an RF signal 308, or multiple RF signals 308, toward satellite 102 in orbit. RF signal 308 carries a message, or request, containing, for example, initial position 306 and velocity 304. The message may further contain the time of transmission from mobile platform 104. Satellite 102 uses the message to redirect received sunlight 312 to mobile platform 104. In certain embodiments, mobile platform 104 periodically transmits RF signals 308 to satellite 102 to update the position and velocity information for mobile platform 104. The frequency at which mobile platform 104 transmits RF signals 308 may vary from platform to platform. For example, a faster-traveling mobile platform 104, such as an aircraft, may transmit more frequently than a slower-traveling mobile platform 104, such as a ship. Further, the frequency of transmission or any other signal parameter may be adjusted to compensate for weather, flight path, altitude, or any other variable that may affect the accuracy of predicted positions of mobile platform 104.

Satellite 102 receives one or more RF signals 308 and processes the message to determine a target position 310 at which mobile platform will be located sometime in the future based on mobile platform 104's known initial position 306 and velocity 304, and based on the time required for satellite 102 to determine target position 310, direct a beam of light 314 from diffuser system 114, and for the directed beam of light 314 to arrive at mobile platform 104. Satellite 102 computes, for example, the propagation time of beam of light 314 from diffuser system 114 to target position 310. Further, satellite 102 utilizes real-time processing to carry out computations and synchronize control of diffuser system 114 to deliver beam of light 314 to target position 310 at a determinable point in time. Predicted target position 310, in certain embodiments, are compared to updated position and velocity information from subsequent RF signals 308 to measure accuracy of target position 310, and to enable continuous adjustment of computations of target position 310 to improve correlation between target position 310 and the actual position of mobile platform 104. Accordingly, the likelihood of beam of light 314 and mobile platform 104 arriving at target position 310 at the same time is increased.

During the time delay from when RF signal 308 is transmitted from mobile platform 104 to when beam of light 314 arrives, mobile platform 104 travels some distance along path 302 to target position 310. Beam of light 314 and mobile platform 104 arrive at target position 310 at roughly the same time, enabling a PV system 316 of mobile platform 104 to receive the beam of light 314 and convert it into electrical energy. In certain embodiments, system 100 is most effective when path 302 is approximately straight. However, in alternative embodiments, satellite 102 may receive sufficient navigational data from RF signal 308 to accurately determine target position 310 of mobile platform 104 with sufficient precision to properly direct beam of light 314 to be received by PV system 316. For example, when mobile platform 104 is traveling along an arc path, the message transmitted in RF signal 308 may further contain data sufficient for satellite 102 to reconstruct the arc path, such as, for example, an altitude, and a center and radius of the arc, in addition to initial position 306 and velocity 304. In alternative embodiments, RF signal 308 may include various other navigational data for mobile platform 104 that further enable satellite 102 to compute target position 310.

Figure 4:
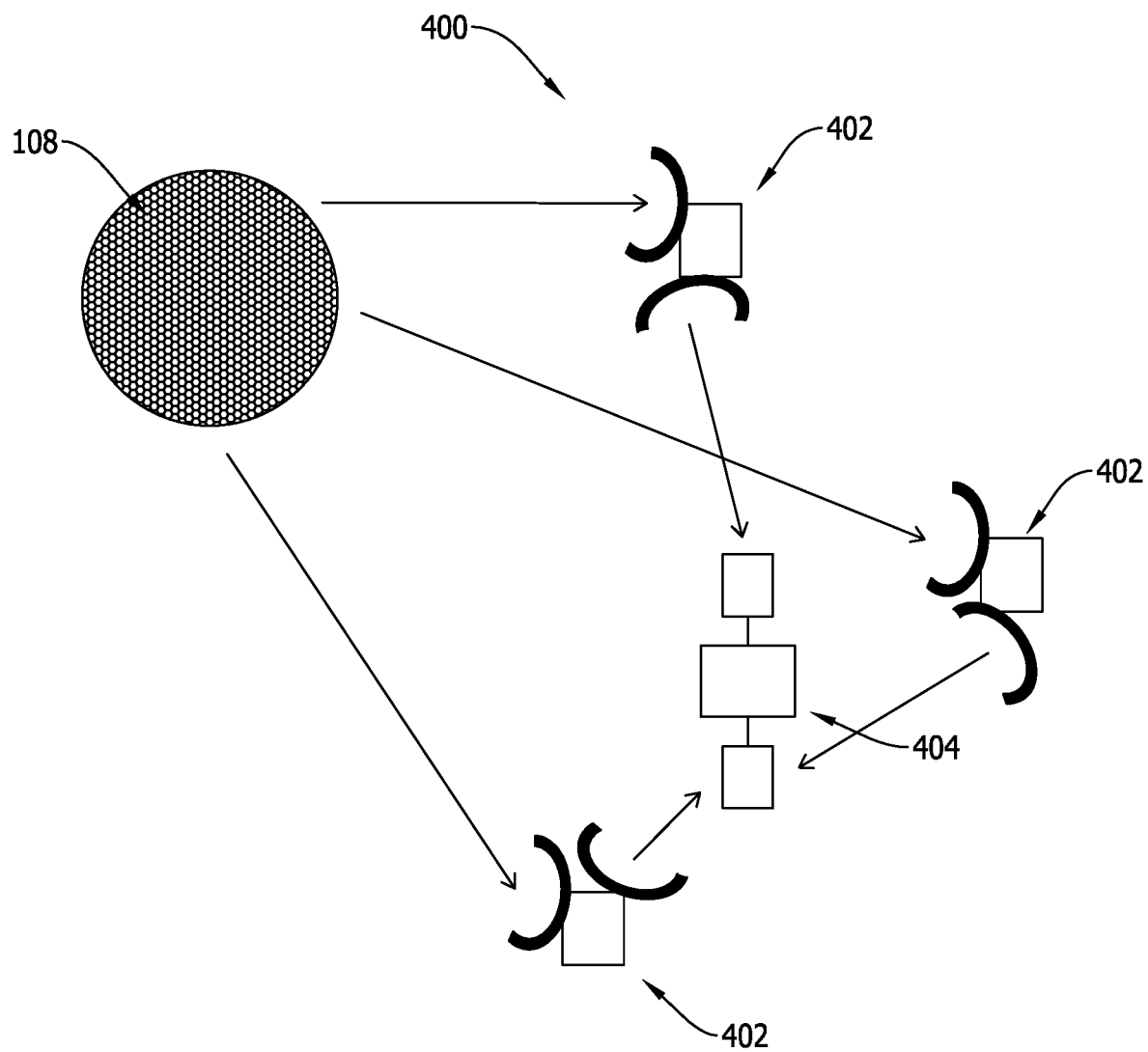
FIG. 4 is a schematic diagram of another embodiment of a system for redirecting sunlight.

FIG. 4 is a schematic diagram of another embodiment of a system 400 for redirecting sunlight. System 400 includes a network of satellites 402 and a mobile platform 404, depicted as a space vehicle. Similar to mobile platform 104 shown in FIGS. 1-3, mobile platform 404 includes a PV system (not shown) that converts received light into electrical energy. Space vehicles, such as satellites, often include a PV system that includes both PV cells and a collector system for gathering and focusing additional light. Such collector systems are typically fixed assemblies located on the outer skin or structure of the space vehicle. Consequently, these fixed assemblies are sensitive to debris strikes that may disable the collector systems. Moreover, the structures necessary to support such collector systems are bulky and increase the mass of the space vehicle.

Mobile platform 404 includes PV cells (not shown) and relies on satellites 402 and their respective collector systems to gather additional light and redirect that light to the PV cells of mobile platform 404. Satellites 402 enable mobile platform to travel through the shadow of Earth (not shown) while still receiving sunlight redirected by satellites 402. Further, by distributing collection systems among satellites 402, the risk of debris strikes disabling the whole system is reduced. In addition, bulky collection systems are no longer necessary to incorporate onto the structure of the mobile platform 404 itself, thereby potentially reducing the size and/or weight of mobile platform 404. Moreover, given that both collector systems and diffuser systems of satellites 402 are able to be directed, satellites can correct for misalignments experienced as a result of a debris strike.

As in system 100, shown in FIGS. 1-3, mobile platform 404 transmits one or more RF signals (not shown in FIG. 4) to satellites 402 that enables satellites 402 to determine a target position of mobile platform 404 sometime in the future. Satellites 402 then direct respective beams of light to the target position of mobile platform 404.

Figure 5:
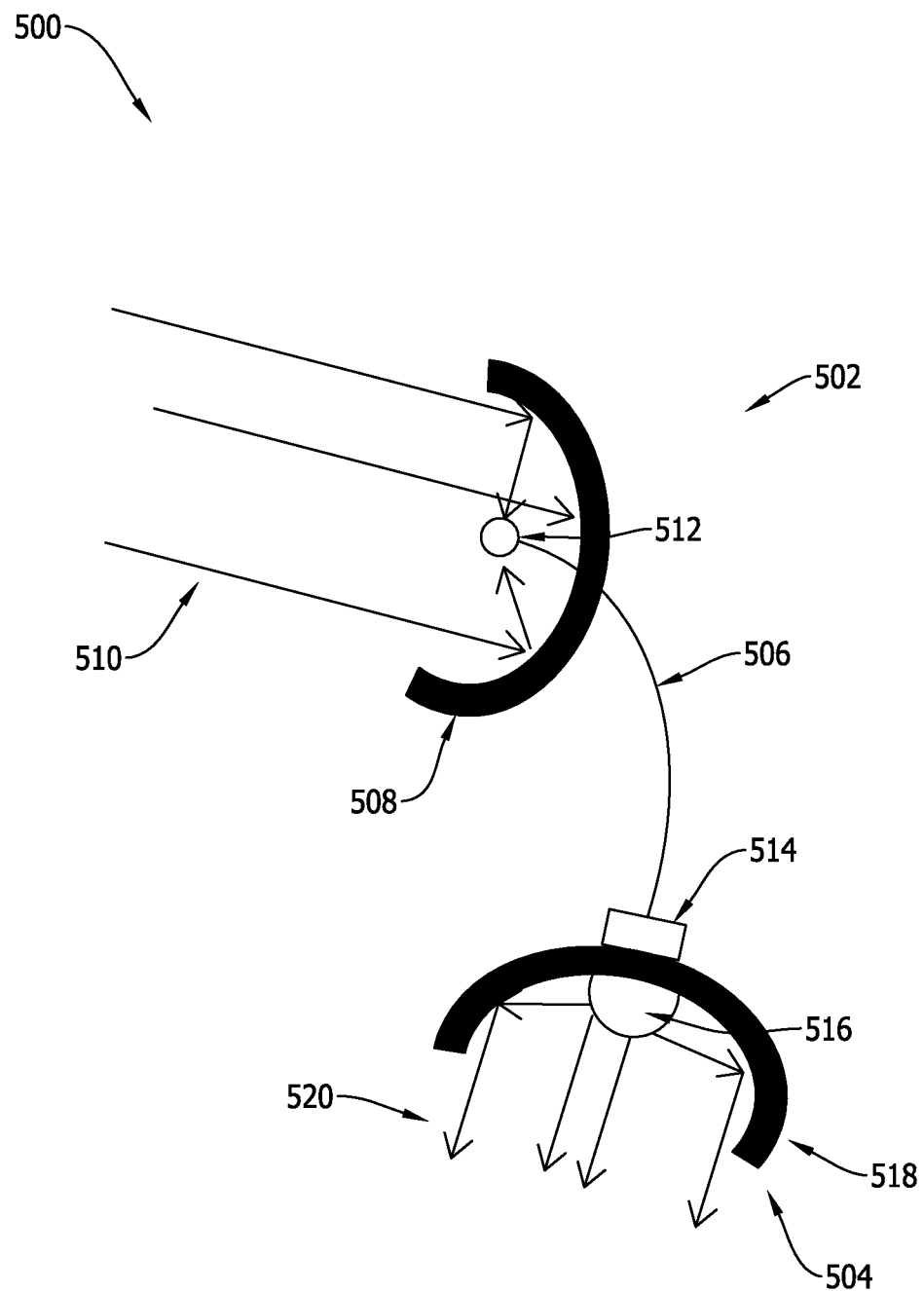
FIG. 5 is a schematic diagram of an embodiment of a satellite for use in the systems shown in FIGS. 1-4.

FIG. 5 is a schematic diagram of an embodiment of a satellite 500 for use in the systems shown in FIGS. 1-4. Satellite 500 includes a collector system 502 and a diffuser system 504 optically coupled together by an optic channel, or fiber optic transmission line 506.

Collector system 502 includes a parabolic reflector 508 that gathers incident light 510 and focus it onto an optical collector 512 optically coupled to fiber optic transmission line 506. Parabolic reflector 508 includes, for example, one or more mirrors shaped such that any light incident on any position of parabolic reflector 508 is reflected to a single focal point where optical collector 512 is positioned. Gathered light is then directed, or transmitted into fiber optic transmission line 506.

Fiber optic transmission line 506 may include one or more transmission lines and may further be composed of plastic optical fiber, glass optical fiber, or any other suitable media for establishing an optical channel for carrying light gathered from collector system 502 to diffuser system 504. Given the amount of energy contained in the gathered light and focused into optical collector 512, fiber optic transmission line 506 is configured to operate with low-loss, and energy lost as the light propagates through fiber optic transmission line 506 is able to be dissipated as, for example, heat.

Diffuser system 504 includes an optical filter 514, a diffusion lens 516, and a parabolic reflector 518. Fiber optic transmission line 506 is optically coupled to optical filter 514. Optical filter 514 is configured to pass a desired spectrum of light. For example, optical filter 514, in certain embodiments, filters out less-efficient wavelengths of light, i.e., wavelengths of light that are less efficiently converted to electrical energy by PV cells. For example, optical filter 514 having a pass-band configured to pass only short wavelengths of light, e.g., ultraviolet (UV), or between 10 nanometers and 400 nanometers, inclusively, which carry more energy and are more efficiently converted to electrical energy than longer wavelengths, e.g., infrared. Moreover, such short wavelengths of light are outside the human-visible spectrum (400 nanometers to 700 nanometers), and therefore do not disrupt human vision or visibly illuminate the target position or the mobile platform, thereby preserving at least some low-observability characteristics of the mobile platform. Wavelengths of light that pass through optical filter 514 then pass through diffusion lens 516. Diffusion lens 516 receives light from fiber optic transmission line 506 and optical filter 514 and directs it, for example, radially according to a particular diffusion pattern, such as, for example, a uniform pattern. Light emitted from diffusion lens 516 that is incident on parabolic reflector 518 is reflected away from parabolic reflector 518 in the form of a beam of light 520. Generally, beam of light 520 is approximately the width of parabolic reflector 518. In certain embodiments, the width of beam of light 520 can be adjusted. Beam of light 520 is further directed to a target position by orienting parabolic reflector 518 in an appropriate direction. As the altitude of satellite's 500 orbit increases, the necessary adjustments to the orientation of parabolic reflector 518 decrease, i.e., orientation is adjusted by smaller angles. Orientation of parabolic reflector 518 is controlled, for example, by a motor, actuator, or other suitable electrical or mechanical means, such as, for example, a microelectromechanical system (MEMS) device.

In an alternative embodiment, optical filter 514 may have a pass-band that excludes only the human-visible spectrum (400 nanometers to 700 nanometers). In another embodiment, when illuminating the mobile platform is not a concern, for example, optical filter 514 may have a pass-band configured to pass all wavelengths of light, including infrared, the human-visible spectrum, UV, X-ray, and gamma-ray. In other embodiments, the pass-band is configured to pass any combination of such wavelengths of light.

In certain embodiments, diffuser system 504 may include an additional lens to further focus beam of light 520, thereby reducing losses. In other embodiments, the additional lens may modify the shape of the beam to a desired beam shape, or one that more effectively covers the surfaces of the mobile platform on which PV cells are located.

Figure 6:
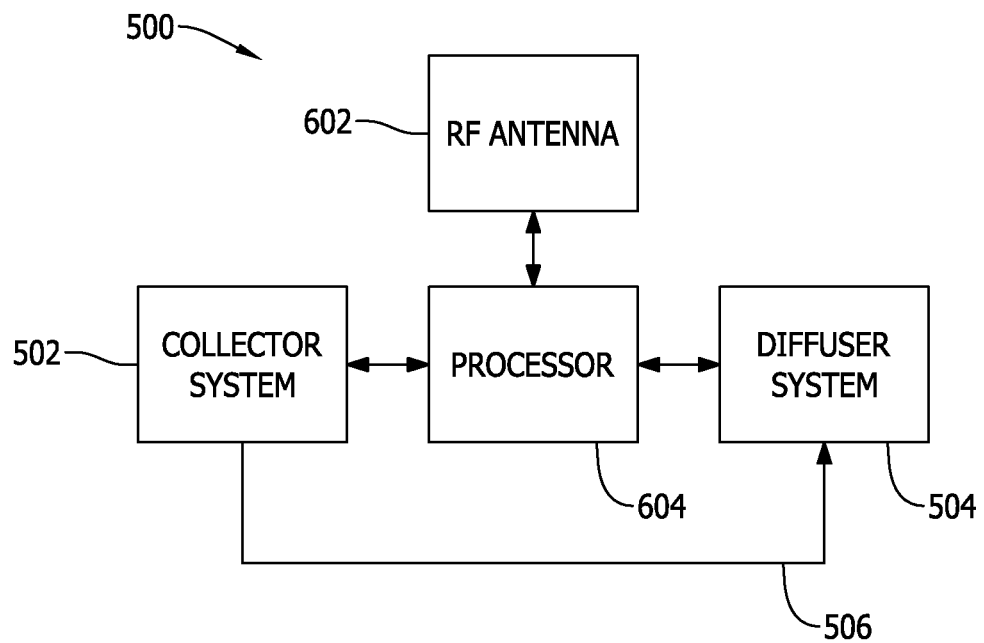
FIG. 6 is a block diagram of the satellite shown in FIG. 5.

FIG. 6 is a block diagram of satellite 500 shown in FIG. 5. Satellite 500 includes collector system 502 and diffuser system 504 (shown in FIG. 5), as well as an RF antenna 602 and a processor 604. RF antenna 602 is configured to receive one or more RF signals, from a mobile platform for example, that carry messages containing navigational data for the mobile platform. Such navigational data may include, for example, time, position, and velocity. Processor 604 is coupled to RF antenna 602 and is configured to compute what the position of the mobile platform will be sometime in the future based on, for example, the position and velocity communicated from the mobile platform via one or more RF signals. Further, processor 604 determines the time delay from when the RF signal was transmitted from the mobile platform to when a redirected beam of light will arrive at the computed target position.

RF antenna 602 is operable in a band of frequencies within the RF spectrum of 20 kilohertz to 300 gigahertz. Satellite 500 may further include an RF transceiver, amplifiers, modulators, analog-to-digital (A/D) converters, and other digital or analog components that enable processor 604 to interface with RF antenna 602.

Processor 604 is further coupled to collector system 502 and diffuser system 504 by, for example, a communication channel such as a parallel channel, a serial channel, analog or discrete signaling, or other suitable communication bus or channel for processor 604 to communicate with collector system 502 and diffuser system 504. Processor 604 is configured to control the orientation of diffuser system 504 and, more specifically, parabolic reflector 518 (shown in FIG. 5) to direct the beam of light 520 (also shown in FIG. 5) to the target position.

Figure 7:
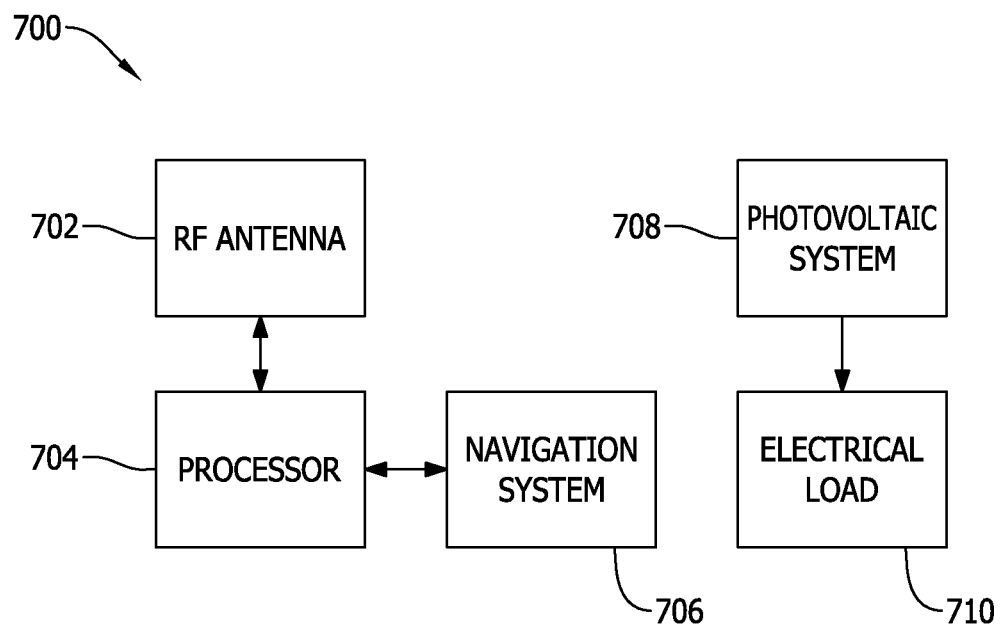
FIG. 7 is a block diagram of an embodiment of a mobile platform for use in the systems shown in FIGS. 1-4.

FIG. 7 is a block diagram of an embodiment of a mobile platform 700 for use in the systems shown in FIGS. 1-4. Mobile platform 700 may be, for example, a land or sea vehicle, an aerial vehicle, or a space vehicle. Mobile platform 700 includes an RF antenna 702, a processor 704, a navigation system 706, a PV system 708, and an electrical load 710.

RF antenna 702 is operable in a band of frequencies within the RF spectrum of 20 kilohertz to 300 gigahertz. Mobile platform 700 may further include an RF transceiver, amplifiers, modulators, analog-to-digital (A/D) converters, and other digital or analog components that enable processor 704 to interface with RF antenna 702.

Processor 704 is coupled to RF antenna 702 and navigation system 706. Navigation system 706 supplies navigational data, such as, for example, time, position, and velocity, of mobile platform 700. Navigation system 706 may include, for example, a global positioning system (GPS) for determining position and velocity. Processor 704 receives navigational data from navigation system 706 and transmits an RF signal through RF antenna 702 carrying a message containing the received navigational data. RF antenna 702 transmits the RF signal toward a satellite, such as, for example, satellite 102, 402, or 500 (shown in FIGS. 1-3, 4, and 5, respectively).

PV system 708 includes one or more PV cells located on the outer skin or structure of mobile platform 700. For example, on an aerial vehicle, PV cells may be located on a top surface of the wings and fuselage. PV system 708 further includes power converters and other power electronics for converting and conditioning electrical power generated by the PV cells to be suitable for supply to electrical load 710. Electrical load 710 may include any electrical load, including, for example, an energy storage device such as a chemical battery, an electronic circuit such as navigation system 706 or processor 704, or a propulsion system such as an electric motor.

Figure 8:
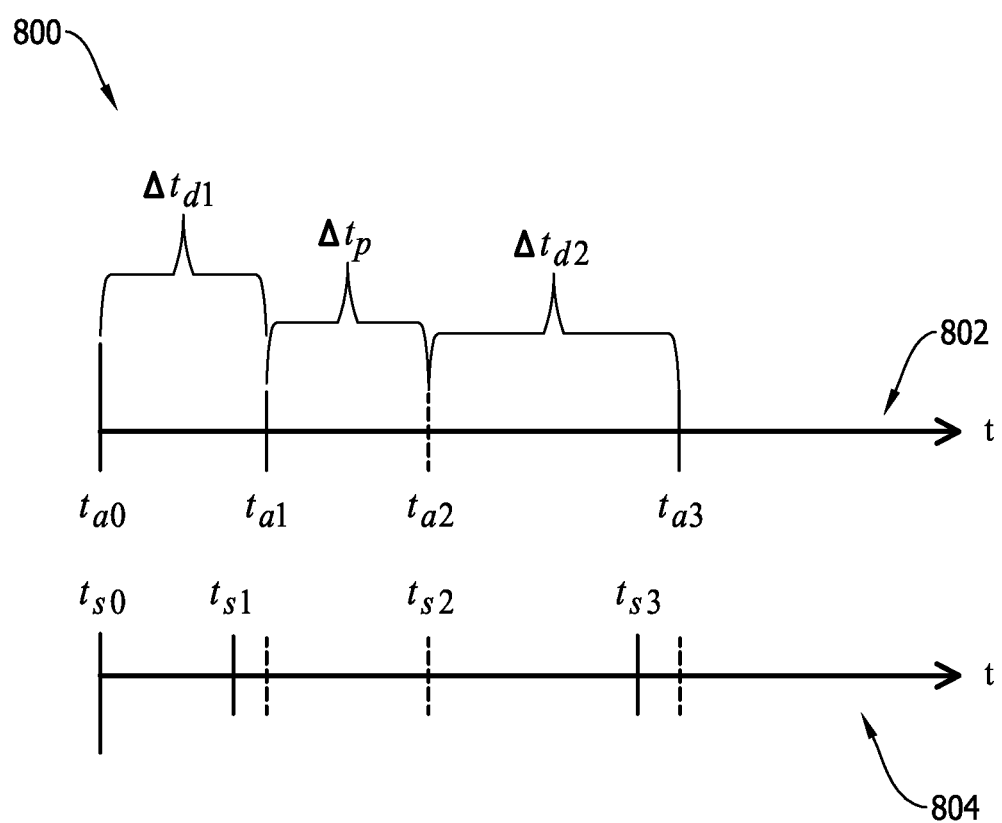
FIG. 8 is an example timing diagram for the systems shown in FIGS. 1-4.

FIG. 8 is an example timing diagram 800 for the systems shown in FIGS. 1-4. Timing diagram 800 includes a mobile platform timeline 802 and a satellite timeline 804, and illustrates timing of an embodiment of the systems and methods described herein for redirecting sunlight from a satellite, such as satellite 102, 402, or 500 (shown in FIGS. 1-3, 4, and 5, respectively) to a mobile platform, such as, for example, mobile platform 104, mobile platform 404, or mobile platform 700 (shown in FIGS. 1-3, 4, and 7, respectively).

Notably, due to time dilation between a satellite (that is orbiting Earth, for example) and a mobile platform on the surface or at altitude, time on the satellite elapses slower than on the mobile platform, as is well understood in the art. Time dilation is a difference in elapsed time as measured by two observers, e.g., satellite 500 and mobile platform 700. Time dilation may occur due to a relative velocity between the two observers (i.e., velocity time dilation), or may occur due to being differently-disposed in a gravitational field, such as that of Earth or another object of sufficient mass (i.e., gravity time dilation). More specifically, for satellite 500 and mobile platform 700 for example, time elapses slower on satellite 500 due to its velocity, and time elapses slower on mobile platform 700 due to its experiencing a stronger gravitational field. The net relativistic effect is that time elapses slower on satellite 500 than on mobile platform 700 when mobile platform 700 is, for example, a land or sea vehicle, or an airborne aircraft. The net relativistic effect is reduced when mobile platform 700 is, for example, another space vehicle, such as another satellite. In either case, the net relativistic effect may be computed according to, for example, the Schwarzschild equation.

Figure 9:
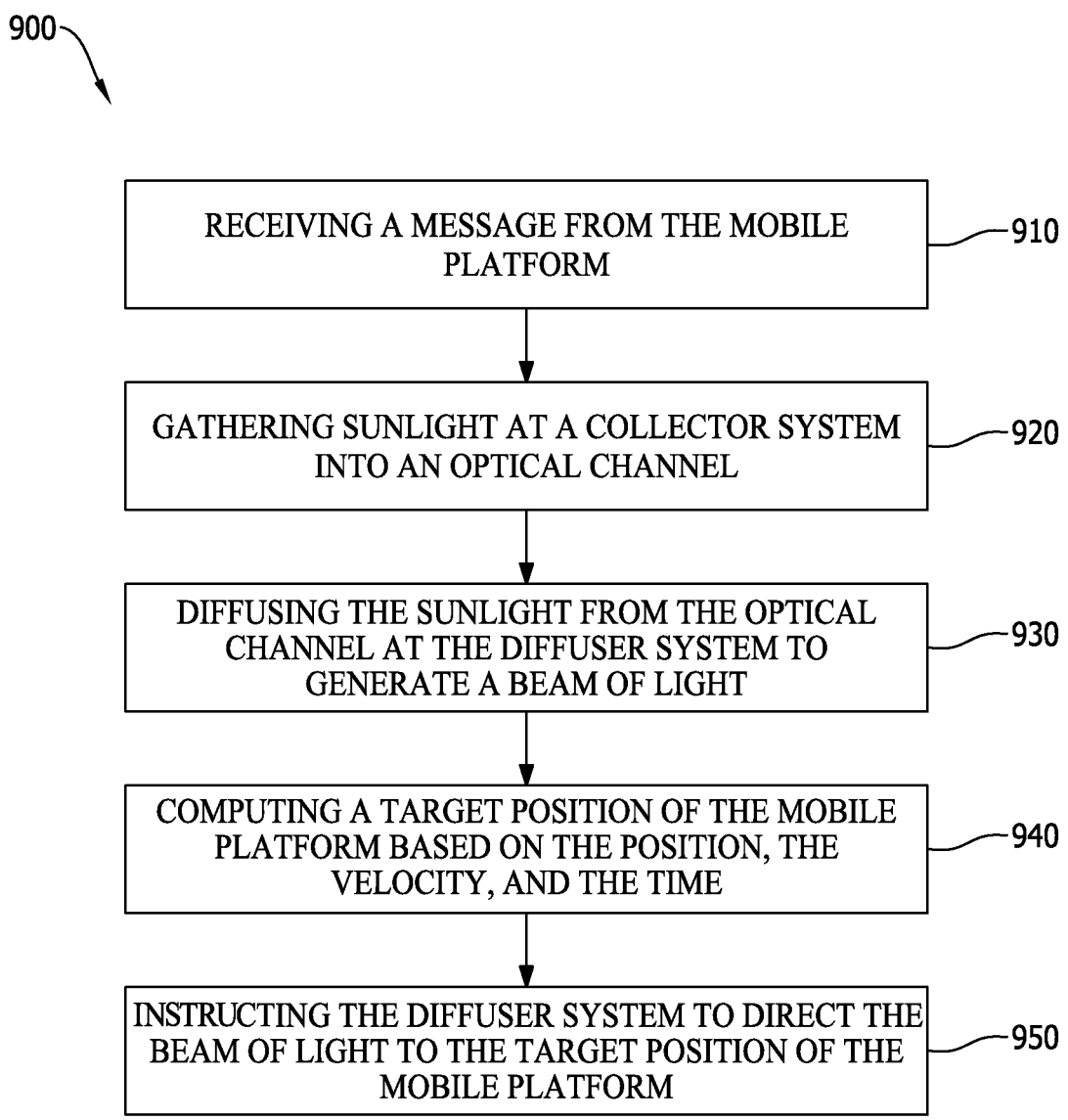
FIG. 9 is a flow diagram of an embodiment of a method of redirecting sunlight from a satellite to a mobile platform.

FIG. 9 is a flow diagram of an embodiment of a method 900 of redirecting sunlight from a satellite to a mobile platform. Method 900 is described below with respect to FIGS. 5-9. Mobile platform 700 travels along a path at some velocity, and transmits an RF signal, or a plurality of RF signals, from an RF antenna toward a satellite, such as satellite 102 (shown in FIGS. 1-3), satellites 402 (shown in FIG. 4), or satellite 500 (shown in FIG. 5). The RF signal carries a message, or a request, from mobile platform 700 that includes navigational data for mobile platform 700. The navigational data may include, for example, a current position of mobile platform 700 on the path, the velocity, and a time at which the transmission is made, or $t_{a0}$. The RF signal is received 910 at satellite 500 using RF antenna 602 after a transit duration, $\Delta t_{d1}$. Mobile platform 700 then waits for a processing duration $\Delta t_p$, during which satellite 500 receives and processes the request, and another transit duration $\Delta t_{d2}$, during which beam of light 520 travels from satellite 500 to mobile platform 700. The time, $t_{a3}$, at which beam of light 520 arrives at mobile platform 700 is computed as the sum of $t_{a0}$, $\Delta t_{d1}$, $\Delta t_p$, and $\Delta t_{d2}$, during which mobile platform 700 travels along the path to the target position.

Collector system 502 of satellite 500 gathers 920 sunlight into the optical channel, or fiber optic transmission line 506, using parabolic reflector 508 and optical collector 512. The sunlight propagates through the optical channel, fiber optic transmission line 506, and emits through diffusion lens 516 of diffuser system 504. Light diffused 930 by diffusion lens 516 is reflected off of parabolic reflector 518 to generate beam of light 520.

Satellite 500 and, more specifically, processor 604, processes the message from mobile platform 700. On satellite 500, the message transmitted at time $t_{s0}$ is received at time $t_{s1}$, which appears "earlier" on satellite timeline 804 than time $t_{a1}$ on mobile platform timeline 802, due to the slower elapse of time $\Delta t_{d1}$ on satellite 500. Processor 604 then computes 940 the target position of mobile platform 700 based on the position, the velocity, and $t_{a0}$. Processor 604 computes each of $\Delta t_{d1}$, $\Delta t_p$, and $\Delta t_{d2}$. $\Delta t_{d1}$ is determinable based on $t_{s1}$ and known relativistic effects. More specifically, processor 604 computes $t_{a1}$, which is the time at which the message was received with respect to mobile platform 700, based on $t_{s1}$ and known relativistic effects. Processor 604 defines a constant amount of time, $\Delta t_p$, or a delay, until satellite 500 emits beam of light 520 from diffuser system 504. For example, if processor 604 requires 5 milliseconds to process the message, compute $t_{a3}$, compute the target position of mobile platform 700, compute the position of satellite 500 at $t_{a3}$, compute the distance between satellite 500 and mobile platform 700, launch beam of light 520, and for beam of light 520 to travel to mobile platform 700; then satellite 500 can wait an additional amount of buffer time, e.g., 5 milliseconds, before launching beam of light 520. Accordingly, in this example, $\Delta t_p$ is 10 milliseconds. This constant time enables synchronization of satellite 500 and mobile platform 700. $\Delta t_{d2}$, as mentioned above, is the time required for beam of light 520 to travel from satellite 500 to mobile platform 700.

Satellite 500 launches and directs 950 beam of light 520 from diffuser system 504 at a time $t_{s2}$ to the target position of mobile platform 700. Beam of light 520 arrives at mobile platform 700 at $t_{a3}$, which is perceived on satellite timeline 804 as time $t_{s3}$, due to relativistic effects.

The above described embodiments of the systems described herein provide a satellite operating in the path of sunlight and that redirects at least some sunlight to a known position of a mobile platform. The redirected sunlight arrives at the mobile platform in the form of a beam that is received by onboard PV cells and converted to electrical energy that is supplied to an electrical load, such as, for example, an energy storage system, an electronic system, or a propulsion system. Embodiments of the satellites described herein provide a collector, or solar collector, that gathers sunlight and directs it into an optical channel that carries the sunlight to a diffuser, or solar diffuser, that transmits a beam of light directed to a location of the mobile platform. Embodiments of the mobile platforms described herein travel along a known path and communicate their position and trajectory, e.g., velocity, to the satellite to enable the satellite to direct the beam of light to an appropriate location for the mobile platform to receive. Such mobile platforms further provide PV cells that receive the beam of light and convert the light into electrical energy. In certain embodiments, the mobile platforms described herein are aerial vehicles or space vehicles, manned or unmanned. Manned mobile platforms experience diminished benefits of the system described herein, because such mobile platforms are typically larger, demand more energy, and are further limited in time of operation to the extent onboard human personnel cannot operate indefinitely. Conversely, unmanned aerial vehicles (UAV) are generally more energy-efficient and are not limited by human personnel. Alternative embodiments of the systems described herein are equally applicable to land or sea vehicles, however, the performance of the system is subject to the ability of the mobile platform to receive a beam of light unobstructed by terrain or weather.

Example technical effects of the methods, systems, and apparatus described herein include at least one of: (a) redirecting of sunlight from a satellite in orbit to a mobile platform; (b) improving efficiency of PV cells on mobile platforms; (c) enabling PV cells on mobile platforms to operate when the mobile platform is not exposed to direct sunlight, e.g., at night, by redirection of sunlight; (d) filtering of redirected sunlight to exclude the human-visible spectrum; (e) reducing the need for collector systems on space vehicles; and (f) enabling longer time of operation of mobile platforms by providing redirected sunlight to PV cells during periods of darkness, e.g., night.

Some embodiments involve the use of one or more electronic processing or computing devices. As used herein, the terms "processor" and "computer" and related terms, e.g., "processing device," "computing device," and "controller" are not limited to just those integrated circuits referred to in the art as a computer, but broadly refers to a processor, a processing device, a controller, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processing (DSP) device, an application specific integrated circuit (ASIC), and other programmable circuits or processing devices capable of executing the functions described herein, and these terms are used interchangeably herein. The above are examples only, and thus are not intended to limit in any way the definition or meaning of the terms processor, processing device, and related terms.

In the embodiments described herein, memory may include, but is not limited to, a non-transitory computer-readable medium, such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal. Alternatively, a floppy disk, a compact disc-read only memory (CD-ROM), a magneto-optical disk (MOD), a digital versatile disc (DVD), or any other computer-based device implemented in any method or technology for short-term and long-term storage of information, such as, computer-readable instructions, data structures, program modules and sub-modules, or other data may also be used. Therefore, the methods described herein may be encoded as executable instructions, e.g., "software" and "firmware," embodied in a non-transitory computer-readable medium. Further, as used herein, the terms "software" and "firmware" are interchangeable, and include any computer program stored in memory for execution by personal computers, workstations, clients and servers. Such instructions, when executed by a processor, cause the processor to perform at least a portion of the methods described herein.

Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the embodiments described herein, additional output channels may include, but not be limited to, an operator interface monitor.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

As used herein, an element or step recited in the singular and proceeded with the word "a" or "an" should be understood as not excluding plural elements or steps unless such exclusion is explicitly recited. Furthermore, references to "one embodiment" of the present disclosure or "an example embodiment" are not intended to be interpreted as excluding the existence of additional embodiments that also incorporate the recited features.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system, comprising:
 a mobile platform configured to travel along a path, the mobile platform comprising:
  a first radio frequency (RF) antenna configured to transmit trajectory data for the mobile platform, and
  a photovoltaic cell configured to convert a beam of light into electrical energy; and
 a satellite comprising:
  a second RF antenna configured to receive the trajectory data from the mobile platform;
  a processor coupled to the second RF antenna and configured to:
   compute a target position of the mobile platform based on the trajectory data; and
   instruct a diffuser system to generate the beam of light from a light source and direct the beam to the target position of the mobile platform.

2. The system of claim 1, wherein the mobile platform further comprises an unmanned aerial vehicle (UAV) configured to operate at an altitude above 30,000 feet above sea level.

3. The system of claim 1, wherein the mobile platform further comprises an electrical load comprising at least one of an energy storage device, an electronic system, or a propulsion system.

4. The system of claim 1, wherein the satellite further comprises a collector system coupled to an optical channel and configured to gather sunlight into the optical channel.

5. The system of claim 1, wherein the satellite further comprises the diffuser system coupled to an optical channel and configured to diffuse light from the optical channel to generate the beam of light.

6. The system of claim 5, wherein the diffuser system comprises:
 a parabolic reflector configured to reflect light emitted from a focal point to generate the beam of light; and
 a diffusion lens optically coupled to the optical channel, disposed at the focal point, and configured to diffuse light propagating through the optical channel and emitted from the diffusion lens.

7. The system of claim 5, wherein the diffuser system further comprises an optical filter having a pass-band configured to pass a desired spectrum of light excluding a human-visible spectrum.

8. A method, comprising:
 receiving a message from a mobile platform at a radio frequency (RF) antenna of a satellite, the message comprising trajectory data associated with the mobile platform;
 gathering light at a collector system of the satellite;
 generating a beam of light from gathered light;
 computing, using a processor coupled to the RF antenna, a target position of the mobile platform based on the trajectory data; and
 directing the beam of light to the target position of the mobile platform.

9. The method of claim 8 further comprising filtering the light emitted in the beam of light to exclude a human-visible spectrum.

10. The method of claim 8, wherein computing the target position comprises:
 computing a time at which the message was received with respect to the mobile platform;
 computing a time allotted for the processor to process the message and generate the beam of light;
 computing a time required for the beam of light to travel from the satellite to the mobile platform; and
 computing a distance traveled by the mobile platform between transmitting the message and the beam of light arriving at the mobile platform.

11. The method of claim 10, wherein computing the time allotted for the processor to process the message comprises a buffer time.

12. The method of claim 10, wherein computing the time required for the beam of light to travel from the satellite to the mobile platform comprises computing a distance travelled by the satellite.

13. The method of claim 10, wherein computing the time at which the message was received at the satellite with respect to the mobile platform comprises compensating for at least one of a relative speed or gravity of the satellite compared to the mobile platform.

14. A satellite, comprising:
- a radio frequency (RF) antenna configured to receive trajectory data associated with a mobile platform;
- a processor coupled to the RF antenna and configured to:
  - compute a target position of the mobile platform based on the trajectory data; and
  - instruct a diffuser system to generate a beam of light from a light source and direct the beam to the target position of the mobile platform.

15. The satellite of claim 14, further comprising a collector system coupled to an optical channel and configured to gather light into the optical channel.

16. The satellite of claim 14, further comprising a diffuser system coupled to an optical channel and configured to diffuse light from the optical channel to generate the beam of light.

17. The satellite of claim 16, wherein the diffuser system comprises:
- a parabolic reflector configured to reflect light emitted from a focal point to generate the beam of light; and
- a diffusion lens optically coupled to the optical channel, disposed at the focal point, and configured to diffuse light propagating through the optical channel and emitted from the diffusion lens.

18. The satellite of claim 17, further comprising an optical filter coupled to the optical channel and coupled to the diffusion lens, wherein the optical filter has a pass-band configured to pass only ultraviolet light having wavelengths between 10 and 400 nanometers, inclusively.

19. The satellite of claim 17, wherein the diffuser system further comprises a second diffusion lens optically coupled to an optical filter and configured to diffuse light outside of a pass-band for the optical filter into space.

20. The satellite of claim 17, wherein the diffuser system further comprises a second diffusion lens optically coupled to the diffusion lens to further focus the beam of light into a desired beam shape.

* * * * *